(12) United States Patent
Lewis et al.

(10) Patent No.: US 8,015,395 B1
(45) Date of Patent: Sep. 6, 2011

(54) COMPUTER HAVING RECONFIGURABLE FIELD PROGRAMMABLE GATE ARRAY

(75) Inventors: Shane Lewis, Coolidge, AZ (US); Justin Dyster, Chandler, AZ (US); Layne N. Phillips, Phoenix, AZ (US); Michael Stimpson, Gilbert, AZ (US)

(73) Assignee: RMT, Inc., Tempe, AZ (US)

( * ) Notice: Subject to any disclaimer, the term of this patent is extended or adjusted under 35 U.S.C. 154(b) by 802 days.

(21) Appl. No.: 12/100,298

(22) Filed: Apr. 9, 2008

Related U.S. Application Data

(63) Continuation-in-part of application No. 11/754,478, filed on May 29, 2007, now abandoned, which is a continuation-in-part of application No. 11/317,221, filed on Dec. 22, 2005, now Pat. No. 7,607,005.

(60) Provisional application No. 60/910,682, filed on Apr. 9, 2007, provisional application No. 60/803,490, filed on May 30, 2006, provisional application No. 60/638,711, filed on Dec. 22, 2004.

(51) Int. Cl.
| | |
|---|---|
| G06F 9/00 | (2006.01) |
| G06F 1/00 | (2006.01) |
| G06F 1/26 | (2006.01) |
| G06F 11/30 | (2006.01) |
| G06F 3/00 | (2006.01) |
| G06F 13/12 | (2006.01) |
| G06F 13/00 | (2006.01) |
| G06F 13/14 | (2006.01) |
| G06F 12/00 | (2006.01) |
| G06F 11/00 | (2006.01) |
| G06F 17/50 | (2006.01) |
| G06F 11/22 | (2006.01) |
| G11B 21/02 | (2006.01) |
| H02H 3/00 | (2006.01) |
| H02H 3/08 | (2006.01) |
| H02H 5/04 | (2006.01) |
| H01H 47/00 | (2006.01) |
| G05B 13/02 | (2006.01) |
| G05B 9/02 | (2006.01) |
| G01R 15/00 | (2006.01) |
| G01P 15/00 | (2006.01) |

(52) U.S. Cl. ............... 713/2; 713/1; 713/100; 713/300; 713/320; 360/75; 360/101; 361/88; 361/93.1; 361/103; 361/104; 700/28; 700/79; 702/57; 702/130; 702/141; 702/182; 710/10; 710/62; 710/104; 710/305; 711/102; 711/170; 714/2; 714/25; 714/47.1; 716/101; 716/136

(58) Field of Classification Search .............. 713/1, 2, 713/100, 300, 320; 360/75, 101; 361/88, 361/93.1, 103, 140; 700/28, 79; 702/57, 702/130, 141, 182; 710/10, 62, 104, 305; 711/102, 170; 714/2, 25, 47, 47.1; 716/101, 716/136
See application file for complete search history.

(56) References Cited

U.S. PATENT DOCUMENTS 5,790,965 A * 8/1998 Abe ........................... 701/29

(Continued)

*Primary Examiner* — Stefan Stoynov
(74) *Attorney, Agent, or Firm* — Caesar, Rivise, Bernstein, Cohen & Pokotilow, Ltd.

(57) ABSTRACT

A personal computer and methods of reconfiguration are described. An implementation of a personal computer may comprise a processor portion running a diagnostic application. A field programmable gate array in communication with the processor portion may be provided. A configurable non-volatile computer memory in communication with the field programmable gate array and wherein the field programmable gate array is programmed to reconfigure the non-volatile computer memory may be provided. Methods of reconfiguration of a personal computer are provided.

12 Claims, 6 Drawing Sheets

U.S. PATENT DOCUMENTS

| | | |
|---|---|---|
| 6,775,760 B1 | 8/2004 | Shigeki |
| 7,102,384 B1 * | 9/2006 | Speers et al. .................... 326/39 |
| 7,138,820 B2 * | 11/2006 | Goetting et al. ................. 326/9 |
| 7,343,579 B2 * | 3/2008 | Coxe et al. .................... 716/101 |
| 7,355,807 B2 * | 4/2008 | Jeansonne et al. ............. 360/75 |
| 7,856,546 B2 * | 12/2010 | Casselman et al. ............. 712/43 |

* cited by examiner

COMPUTER HAVING RECONFIGURABLE FIELD PROGRAMMABLE GATE ARRAY

CROSS REFERENCE TO RELATED APPLICATIONS

This document claims the benefit of the filing date of commonly owned U.S. Provisional Patent Application 60/910,682, entitled "STATUS AND CONTROL SOFTWARE" to Lewis et al. which was filed on Apr. 9, 2007, the contents of which are hereby incorporated herein by reference.

This document is also a continuation-in-part application of commonly owned U.S. patent application Ser. No. 11/754,478, entitled "COMPUTER HAVING RECONFIGURABLE GENERAL-PURPOSE EXTERNAL INTERFACE" to Dyster, et al., which claims priority to U.S. Provisional Patent Application 60/803,490, entitled "COMPUTER SYSTEM" to Lewis et al. which was filed on May 30, 2006, and which is a continuation-in-part application of commonly owned U.S. patent application Ser. No. 11/317,221, entitled "VIRTUAL HARDWARE SYSTEM WITH UNIVERSAL PORTS USING FPGA" to Lewis, filed on Dec. 22, 2005, which claims priority to commonly owned United States provisional patent application entitled "ROGUE COMPUTER AND HANDHELD GAMING SYSTEM," SERIAL NUMBER 60/638,711 TO Lewis, filed on Dec. 22, 2004, the disclosures of which are hereby incorporated herein by reference.

BACKGROUND

1. Technical Field

Aspects of this document relate generally to personal computers having field programmable gate arrays.

2. Background Art

Monitorability, diagnosability, and repairability of personal computers play an important role in maintaining the reliable and efficient operation of mobile personal computers used in rugged environments. Mobile computers used in extreme temperature and/or extreme geography environments may not operate under the same operating parameters as a conventional computer and have more opportunities for problems and malfunctions than a conventional desktop or even laptop computer, and are typically in locations where repair facilities and technicians are hard to come by. Improved methods and systems for efficiently monitoring, diagnosing and repairing mobile computers used in rugged environments are needed.

SUMMARY

In one aspect, a personal computer having a field programmable gate array comprises a processor portion running a diagnostic application. In another aspect, particular implementations may comprise a field programmable gate array in communication with the processor portion. In yet another aspect, particular implementations may comprise a configurable non-volatile computer memory interconnected with the field programmable gate array wherein the field programmable gate array is programmed to reconfigure the non-volatile computer memory.

Particular implementations of personal computers having field programmable gate arrays may include one or more of the following. The non-volatile computer memory may comprise Flash memory. The personal computer may comprise a battery, a system voltage, at least one analog to digital converter associated with the system voltage wherein the non-volatile computer memory is configured to store a first predetermined voltage level and a second predetermined voltage level. The personal computer may further comprise a field programmable gate array programmed to read an output from the at least one analog to digital converter, monitor the system voltage and monitor a backup battery if the system voltage falls below the first predetermined voltage level, and shut down if the system voltage falls below the second predetermined voltage level. An accelerometer may be coupled to the personal computer and associated with the field programmable gate array, the accelerometer may be configured to monitor gravity induced reaction forces and generate an output. At least one hard drive inside the housing of the personal computer with at least one hard drive head. The field programmable gate array may be programmed to monitor the output of the accelerometer for a free fall condition and issue a command to the at least one hard drive to park the at least one hard drive head.

Particular implementations of personal computers having field programmable gate arrays may also include one or more of the following. The field programmable gate array may be programmed to save accelerometer data in the configurable non-volatile computer memory when the accelerometer data exceeds a predetermined criteria boundary. At least one software application and at least one diagnostic application running on the processor portion, wherein the at least one diagnostic application is configured to receive the accelerometer data and provide the accelerometer data to the at least one software application may be provided. The field programmable gate array may be programmed with a first set of hardware parameters. The personal computer may further comprise an environmental characteristic sensor configured to monitor a characteristic of the environment inside or outside of a housing of the personal computer and generate an output indicative of the characteristic, and at least one diagnostic application running on the processor portion, wherein the at least one diagnostic application is configured to receive data from the output of the environmental characteristic sensor and reprogram the field programmable gate array with a second set of hardware parameters different from the first set of hardware parameters to add new functionality to the field programmable gate array in response to a need indicated by the environmental characteristic sensor output.

Particular implementations of personal computers having field programmable gate arrays may further include one or more of the following. The field programmable gate array may be programmed to save environmental characteristic sensor data on the configurable non-volatile computer memory when the environmental characteristic sensor data exceeds a predetermined criteria boundary. The personal computer may further comprise a wireless communication receiver, wherein the second set of hardware parameters is received by the personal computer through the wireless communication receiver. The non-volatile computer memory may be configured to store a first set of processor operating thresholds. The personal computer may further comprise an environmental characteristic sensor configured to monitor a characteristic of the environment inside or outside of a housing of the personal computer and generate an output indicative of the characteristic, and at least one diagnostic application running on the processor portion, wherein the at least one diagnostic application is configured to receive data indicative of the output of the environmental characteristic sensor and turn off the personal computer if the output exceeds the first set of processor operating thresholds. The field programmable gate array may be programmed to monitor the output of the environmental characteristic sensor and operation of the processor portion and turn off the personal computer if the output exceeds the first set of processor operating thresholds and the diagnostic application failed to turn off the personal computer. The field programmable gate array may be programmed with a first set of hardware parameters and the at least one diagnostic application is configured to reprogram the field programmable gate array with a second set of hardware parameters different from the first set of hardware parameters and replace the first set of processor operating thresholds with a second set of processor operating thresholds different from the first set of processor operating thresholds to add new functionality to the field programmable gate array through the processor portion and modify the operating conditions under which the field programmable gate array may be programmed to turn off the personal computer. The non-volatile computer memory may be configured to store a set of temperature thresholds. The personal computer may further comprise a temperature sensor configured to monitor a temperature inside a housing of the personal computer and generate an output indicative of the temperature, and a system cooling fan, wherein the field programmable gate array is programmed to monitor the output of the temperature sensor and turn on the fan if the temperature exceeds a first threshold of the set of temperature thresholds and turn off the personal computer if the temperature exceeds a second threshold of the set of temperature thresholds.

In another aspect, a method of reconfiguring a personal computer is provided. The method comprises monitoring an environmental characteristic of a personal computer through an environmental characteristic sensor, generating an output from the environmental characteristic sensor indicative of the monitored environmental characteristic, receiving data indicative of the output of the environmental characteristic sensor with a diagnostic application running on a processor within the personal computer, identifying through the diagnostic application a need indicated by the output of the environmental characteristic sensor, and reprogramming a field programmable gate array associated with the processor within the personal computer from a first set of hardware parameters to a second set of hardware parameters different from the first set of hardware parameters to add new functionality to the field programmable gate array to resolve the need identified by the diagnostic application.

Particular implementations of methods of reconfiguring a personal computer may include one or more of the following. Monitoring the output of the environmental characteristic sensor and reprogramming the field programmable gate array with a second set of hardware parameters different from the first set of hardware parameters to add new functionality to the field programmable gate array in response to a need indicated by the environmental characteristic sensor output may further comprise reconfiguring the field programmable gate array with a second set of hardware parameters through a wireless communication receiver.

In another aspect, another method of reconfiguring a personal computer is provided. The method comprises monitoring gravity induced reaction forces on a personal computer through an accelerometer coupled to a personal computer, generating an output from the accelerometer indicative of the gravity induced reaction forces, monitoring the output of accelerometer with a field programmable gate array, identifying a free fall condition indicated by the output of the accelerometer through the field programmable gate array, and issuing a command from the field programmable gate array to a hard drive of the personal computer to park one or more hard drive heads of the hard drive.

Particular implementations of methods of reconfiguring a personal computer may include one or more of the following. The method may comprise storing accelerometer data indicative of the output of the accelerometer on a non-volatile computer memory and/or a hard drive or other memory of the personal computer. The method may further comprise receiving data indicative of the output of the accelerometer in a diagnostic application running on a processor of the personal computer and providing an output from the diagnostic application to at least one other software application running on the processor of the personal computer.

In another aspect, another method of reconfiguring a personal computer is provided. The method comprises storing a first set of processor operating thresholds in a non-volatile computer memory, monitoring a characteristic of an environment inside or outside of a housing of a personal computer with an environmental characteristic sensor and generating an output indicative of the characteristic monitored, monitoring data indicative of the output of the environmental characteristic sensor with a diagnostic application running on the processor, instructing the processor through the diagnostic application to turn off the personal computer if the output exceeds the first set of processor operating thresholds, monitoring the output of the environmental characteristic sensor and the operation of the processor through a field programmable gate array within the personal computer, and instructing the processor through the field programmable gate array to turn off the personal computer if the diagnostic application failed to turn off the personal computer and the output exceeds the first set of processor operating thresholds.

The foregoing and other aspects, features, and advantages will be apparent to those artisans of ordinary skill in the art from the DESCRIPTION and DRAWINGS, and from the CLAIMS.

BRIEF DESCRIPTION OF THE DRAWINGS

The invention will hereinafter be described in conjunction with the appended drawings, where like designations denote like elements, and.

DESCRIPTION

This disclosure, its aspects and implementations, are not limited to the specific components or configurations disclosed herein. Many additional components and configurations known in the art will become apparent for use with implementations of rugged mobile personal computers from this disclosure. Accordingly, for example, although particular methods and configurations are disclosed, such methods, configurations and implementing components may comprise any shape, size, style, type, model, version, measurement, concentration, material, quantity, and/or the like as is known in the art for such methods, configurations and implementing components, consistent with the intended operation of personal computers.

Three advantages are made possible, either in combination or separately, from particular implementations of a personal computing system disclosed in the present application. Those advantages include monitorability, remote diagnosability and remote repairability. Rugged mobile computing systems are often used in extreme environmental conditions, such as extremely hot or cold temperatures, are subject to greater vibrational and mechanical strains and are less available for standard repair than conventional personal computers. As a result, operational problems associated with rugged mobile computers pose a unique set of problems. Rugged mobile computers in extreme cases may be used in extremely remote regions where conventional repair or replacement is impractical. Examples include those rugged mobile computers used by workers in the desert or arctic regions who may be out for weeks or months at a time and rely on the functionality of their computers for the work they are doing or, in many cases, for their survival in the extreme locations. As such, the ability to monitor system functions and operations, remotely diagnose and in some cases remotely repair those functions and operations is extremely beneficial.

Figure 1:
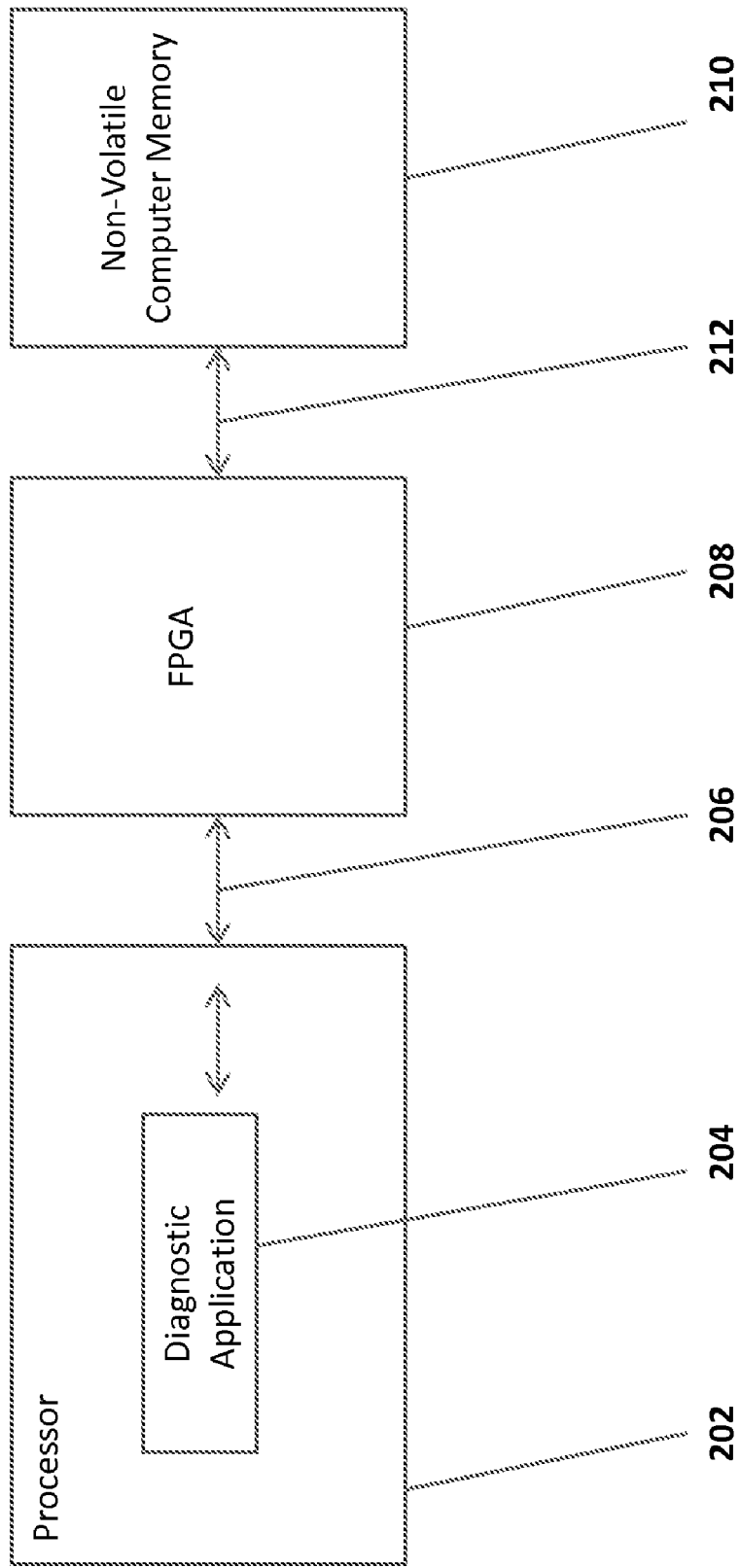
FIG. 1 is a block diagram of a portion of a particular implementation of a personal computer having a processor and a field-programmable gate array (FPGA)

FIG. 1 illustrates a particular implementation of a personal computer having a field-programmable gate array (FPGA) closely associated with it. The personal computer may be configured similar to any of the implementations of a personal computer described in U.S. patent application Ser. No. 11/754,478, entitled "COMPUTER HAVING RECONFIGURABLE GENERAL-PURPOSE EXTERNAL INTERFACE" to Dyster, et al., with or without the external interface components. In the implementation shown in FIG. 1, the FPGA 208 is programmed to read and store data on a non-volatile computer memory 210, and where the FPGA 208 is in communication with a diagnostic application running on a processor portion 202 of the personal computer. Processor portion 202 may further comprise, for example, a board having disposed thereon a collection of standard chips such as a processor, memory, a north bridge chip, a south bridge chip and the like configured to function as a personal computer. In addition, processor portion 202 may comprise a plurality of processors. As is customary, processor portion 202 supports a collection of standard interfaces (not shown). Typically, processor 202 disclosed is a relatively powerful processor capable of supporting a general-purpose operating system such as, for example, Windows Vista®, Windows XP®, Windows 2000®, Linux, Mac OS®, and the like. Processor portion 202 in this particular implementation is running a diagnostic application 204 and is communicatively coupled to a field-programmable gate array (FPGA) 208 via communication bus 206. Communication bus 206 provides an intercommunication capability between processor portion 202, diagnostic application 204, and FPGA 208. Communication bus 206 in common with other connections described herein, and unless otherwise indicated, may comprise one or more of address, data, clock and control buses.

Still referring to FIG. 1, diagnostic application 204 may comprise software running on processor portion 202. In addition, among other functions described herein, diagnostic application 204 may be configured to reprogram FPGA 208 to add new and/or change existing functionality of FPGA 208. An FPGA is advantageous in that because it is hardware, and when it is programmed the hardware components reconfigure to perform programmed functions, the FPGA hardware is not subject to the "crashing" and "locking up" that is typical of conventional software operating systems running on a processor. Additionally, the FPGA hardware, because it is "field programmable," may be programmed in the field with additional abilities not previously available on the FPGA.

In particular implementations, such as that illustrated with reference to FIG. 2, diagnostic application 204 is configured to reprogram FPGA 208 with a second set of hardware parameters different from a first set of hardware parameters to add new functionality to FPGA 208 in response to a need indicated by the environmental characteristic sensor 314. As used herein, the term "hardware parameters" is intended to refer to the programmed set of gate positions and settings for the FPGA that define its programmed hardware for a particular function. In other words, to reprogram the FPGA with a set of hardware parameters means to program the FPGA in a way that configures its gate array with a particular function. In particular, adding new functionality to FPGA 208 relates to reprogramming FPGA 208 to perform a function not previously performed by the FPGA 208. By way of non-limiting example, environmental characteristic sensor 314 may indicate that the personal computer is operating in an extremely high external temperature environment. In this example, the first set of hardware parameters of the FPGA 208 may not yet include functionality relating to running a system cooling fan in response to being operated in a high-temperature environment (as indicated by environmental characteristic sensor 314). Nevertheless, FPGA 208 can be reprogrammed with a second set of hardware parameters to add new functionality to FPGA such as, in the non-limiting example provided, running a system cooling fan under different conditions or running the system cooling fan at a higher number of revolutions per minute (a functionality not provided for by the first set of operating parameters, in this example). Accordingly, reprogramming FPGA 208 with a second set of hardware parameters to add new functionality to FPGA 208 in response to a need indicated by the environmental characteristic sensor 314 may provide tremendous flexibility with respect to the functionality of the personal computer. In some implementations, diagnostic application 204 can reprogram FPGA 208 by using the FPGA 208 itself to write the FPGA configuration data to non-volatile computer memory 210, which then may be read and implemented by FPGA 208.

Figure 4:
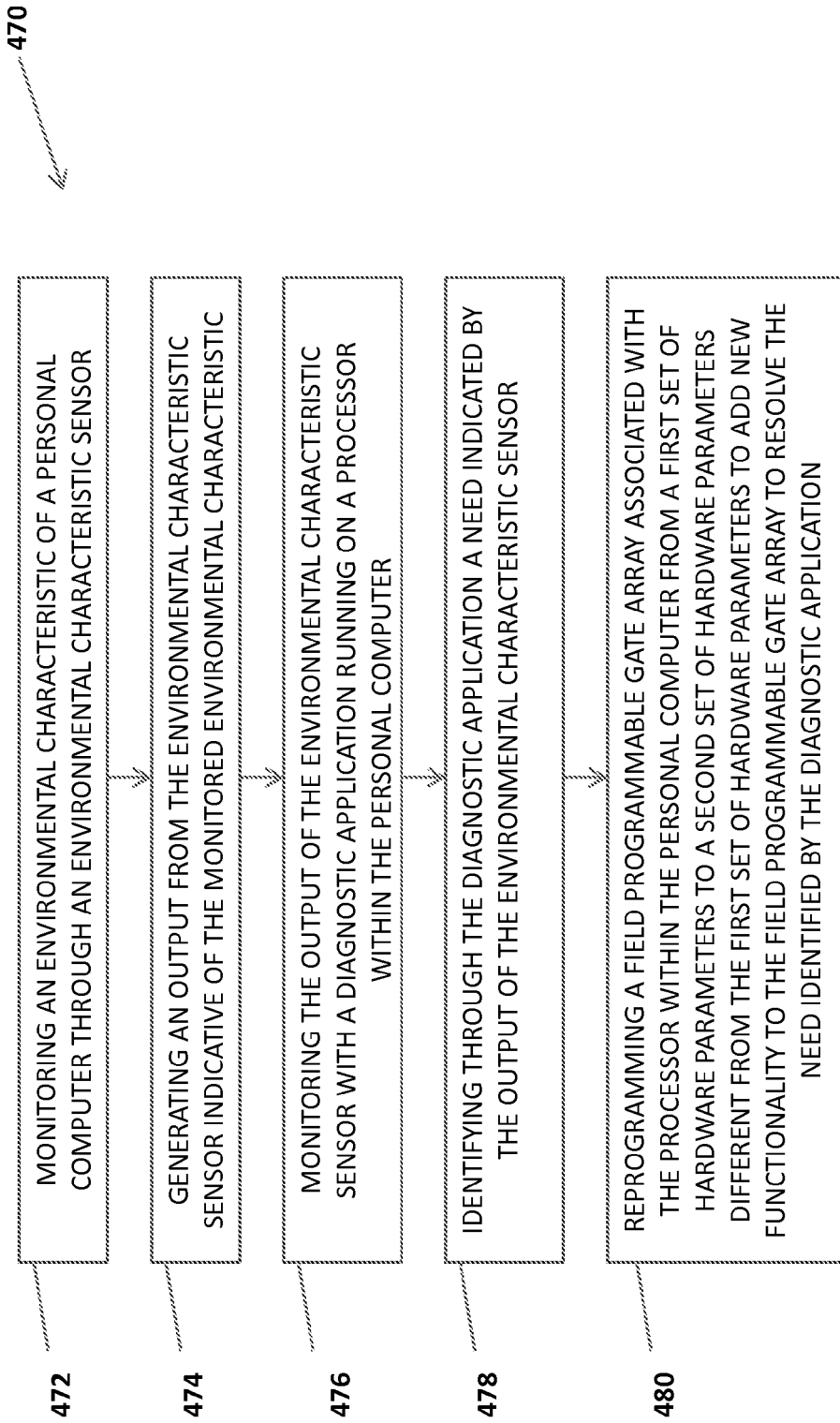
FIG. 4 is a first flow chart illustrating one particular implementation of a method for reconfiguring a personal computer.

Referring to FIG. 4, an example method of reconfiguring a personal computer is illustrated and described. The exemplary method 470 begins at step 472: monitoring an environmental characteristic of a personal computer through an environmental characteristic sensor. Step 474 comprises generating an output from the environmental characteristic sensor indicative of the monitored environmental characteristic. Step 476 comprises monitoring data indicative of the output of the environmental characteristic sensor with a diagnostic application running on a processor within the personal computer, the data being passed to the diagnostic application through the FPGA. In addition, step 478 comprises identifying through the diagnostic application a need indicated by the output of the environmental characteristic sensor. Step 480 comprises reprogramming a field programmable gate array associated with the processor within the personal computer from a first set of hardware parameters to a second set of hardware parameters different from the first set of hardware parameters to add new functionality to the field programmable gate array to resolve the need identified by the diagnostic application.

Referring again to FIG. 2, it will be understood that particular hardware parameter configurations may trigger a response by the FPGA 208 relating to one or more predetermined criteria boundaries (which may comprise a maximum and/or a minimum value which, when exceeded, may cause a particular function/action by FPGA 208). By way of non-limiting example, the FPGA 208 may comprise a first set of hardware parameters that govern a specific function of FPGA 208, such as for the FPGA 208 to shut down the personal computer if the system temperature exceeds a predetermined temperature criteria boundary (such as 90° Celsius (C.) for a specified period of time, for example). Notwithstanding, a user in this example may need or desire to operate the personal computer at a temperature above the predetermined criteria boundary (i.e. at a higher temperature or beyond the specified period of time). The reprogramming of the FPGA 208 may be in response to data received from an environmental characteristic sensor 314 as described in more detail with regard to later examples.

An example of when this may be appropriate includes if the safety features of a particular personal computer shut the computer down, but the computer is being operated in a high temperature region and is being shut down too often. The user may need to alter the settings to allow the personal computer to remain on beyond the originally defined boundary criteria temperature. In a conventional personal computer, these settings cannot be changed by an ordinary user. In particular implementations of a personal computer described herein, the FPGA 208 may be reprogrammed with a second set of hardware parameters to include this functionality and new predetermined criteria boundaries may be stored in non-volatile memory (such as flash memory) associated with the FPGA 208.

Figure 2:
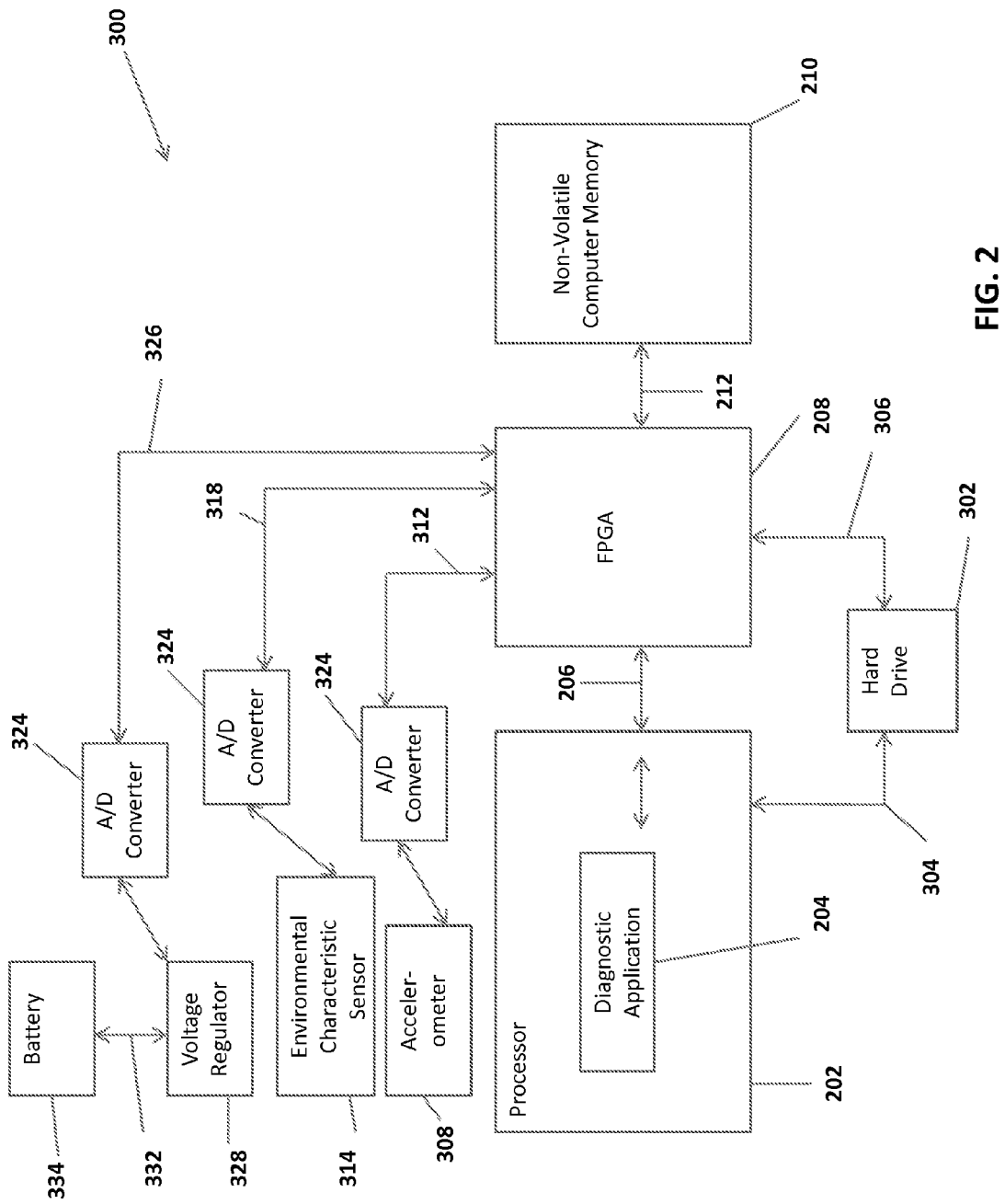
FIG. 2 is a block diagram of a particular implementation of the personal computer of FIG. 1 running a diagnostic application.

Still referring to FIG. 2, in some implementations other environmental characteristic sensors 314 may be communicatively coupled to the FPGA 208 and/or the processor 202. Environmental characteristic sensors 314 may comprise any device capable measuring at least one environmental characteristic and generating an output indicative of the environmental characteristic. Non-limiting examples of environmental characteristic sensors include accelerometers, radiation detectors, light detectors, thermometers, altimeters, hygrometers, barometers and the like. An environmental characteristic sensor 314 may be coupled inside (or even outside) a housing of a personal computer, such as being coupled to a portion of the personal computer like to a circuit board. Environmental characteristic sensor 314 may be communicatively coupled with the FPGA 208 through an A/D converter 324 to provide data to the diagnostic application 204 (via processor portion 202). The FPGA 208 is configured/programmed to store or write data in non-volatile computer memory 210 via connection 212, which may comprise a flash memory storage device. Data stored on non-volatile computer memory 210 can be provided to the diagnostic application 204 through FPGA 208.

In particular implementations, storing the data may comprise, by way of non-limiting example, storing data received from an environmental characteristic sensor such as an accelerometer 308. In other implementations, storing data on non-volatile computer memory 210 may comprise, for example, storing other environmental characteristic data received by the FPGA 208, from an environmental characteristic sensor. In any of the foregoing implementations, data stored on non-volatile computer memory 210 can be analyzed in order to determine, among other things, the severity of an incident or characteristic for which data was stored on non-volatile computer memory 210 and/or possible resultant damage to the personal computer. The stored data may be analyzed by the diagnostic application 204, may be analyzed by hardware programmed into the FPGA, may be analyzed remotely through a wireless connection (see FIG. 3), or the data may be stored long term in the non-volatile computer memory 210 for later analysis. For example, if the personal computer is returned to the manufacturer for having a defect, the manufacturer may be able to analyze the computer data to determine if the personal computer was used outside its warranted operating parameters or was, perhaps, dropped prior to having a malfunction. Access to the environmental characteristic data may also assist a technician or on-board application to more quickly determine the cause of the malfunction and repair it.

In implementations comprising an accelerometer, accelerometer 308 may comprise any device capable measuring the acceleration (including deceleration) identified by gravity-induced reaction forces experienced by the accelerometer (and device to which it may be coupled). The accelerometer 308 generates an output based upon the gravity-induced reaction forces. Accelerometer 308 may be coupled inside a housing of a personal computer and may be in communication with either (or both) diagnostic application 204 and FPGA 208. In the specific implementations illustrated in FIGS. 2 and 3, accelerometer 308 is communicatively coupled with FPGA 208 through an A/D converter 324 and the FPGA 208 provides data indicative of the output of the accelerometer 308 to the diagnostic application 204 (via processor portion 202). In particular implementations, diagnostic application 204 provides the accelerometer data received through the FPGA 208 to one or more software applications which may be running on processor portion 202. Additionally, accelerometer 308 may be communicatively coupled with FPGA 208 through connection 312 and FPGA 208 may be programmed to monitor the output of accelerometer 308 and initiate a specified action when the accelerometer data exceeds a predetermined criteria boundary such as, for example, accelerating at a certain rate for a certain amount of time. By way of non-limiting example, FPGA 208 may monitor the output of the accelerometer 308 for a "free fall" condition (where the personal computer has exceeded a predetermined acceleration criteria boundary, for instance) and issue a command to hard drive 302 (or multiple hard drives) to park one or more hard drive heads (not shown) in order to prevent damage to the one or more hard drive platters. In addition to its described capability of controlling hard drive 302, FPGA 208 may be likewise programmed to control most of the hardware components comprising the personal computer, including the power routes to them. In some particular implementations, diagnostic application 204 sends requests to FPGA 208 for such control to take place. In any event, as described above with respect to FIG. 2, FPGA 208 is programmed to store at least a portion of the data received from accelerometer 308 on non-volatile computer memory 210.

Figure 5:
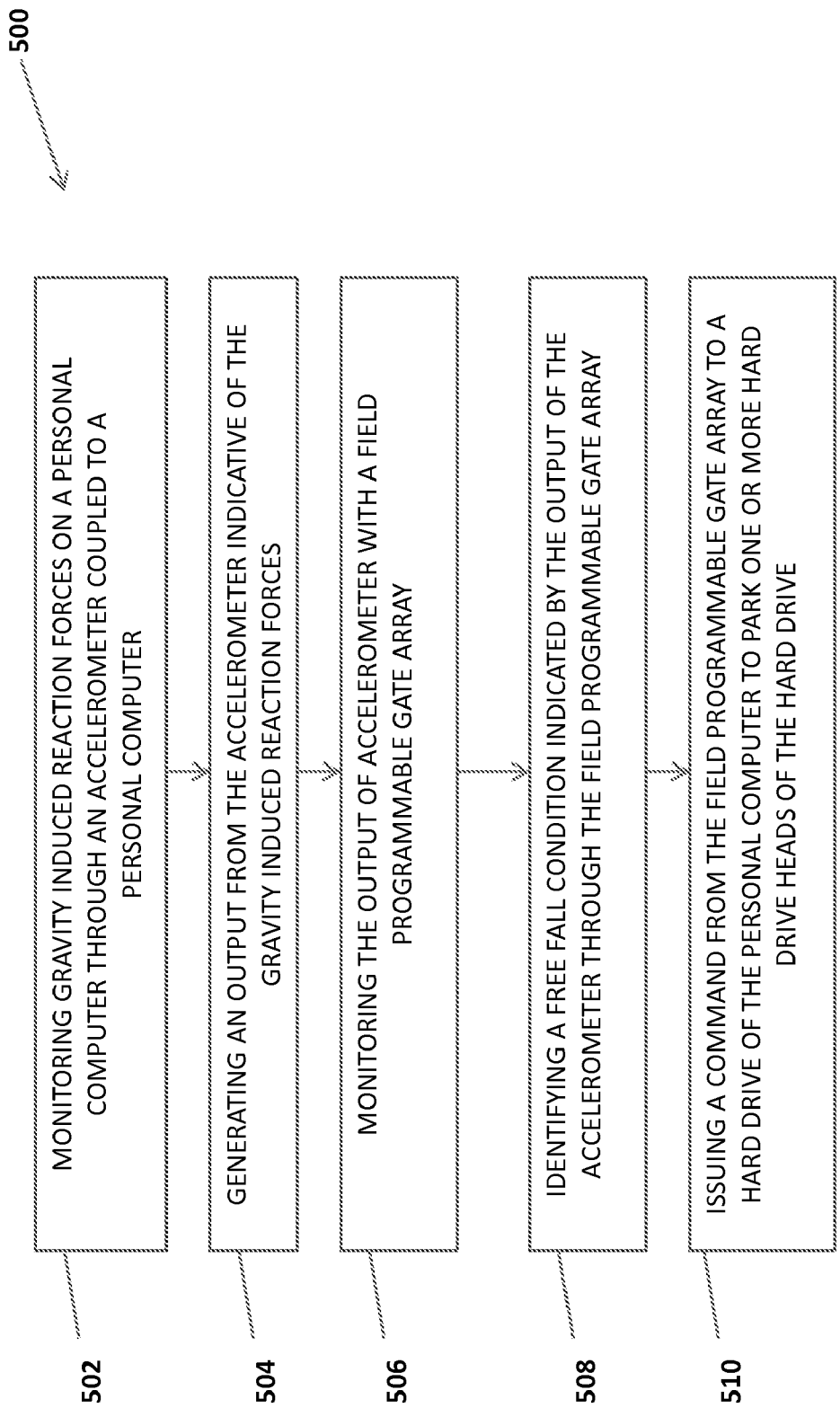
FIG. 5 is a second flow chart illustrating another particular implementation of a method for reconfiguring a personal computer.

FIG. 5 is a second flow chart illustrating another particular implementation of a method for reconfiguring a personal computer. The exemplary method 500 begins at step 502: monitoring gravity induced reaction forces on a personal computer through an accelerometer coupled to a personal computer. Step 504 comprises generating an output from the accelerometer indicative of the gravity induced reaction forces. Step 506 comprises monitoring the output of accelerometer with a field programmable gate array. Step 508 comprises identifying a free fall condition indicated by the output of the accelerometer through the field programmable gate array. Step 510 comprises issuing a command from the field programmable gate array to a hard drive of the personal computer to park one or more hard drive heads of the hard drive.

Referring again to FIG. 2, in another particular implementation, diagnostic application 204 is configured to monitor, through the FPGA 208, the output of an environmental characteristic sensor 314 configured as a thermometer and turn off the personal computer if the output exceeds a first set of processor operating thresholds (for example a maximum or a minimum processor operating temperature). Occasionally, however, a personal computer processor locks up or crashes when running a conventional operating system. When this happens, the personal computer may suffer further damage as a result of being unable to turn off. As an additional safety measure, for particular implementations of a personal computer disclosed herein, the environmental characteristic sensor 314, may be communicatively coupled with FPGA 208 through connection 318. FPGA 208 is programmed to monitor both the output of environmental characteristic sensor 314 and the operation of processor portion 202. In this implementation, FPGA 208 is configured to turn off the personal computer if the output of environmental characteristic sensor 314 exceeds the processor operating thresholds and the diagnostic application 204 has failed to turn off the personal computer. In one particular implementation, when the environmental characteristic sensor 314 is a temperature sensor, the temperature is configured to monitor a temperature inside of the housing of a personal computer and generate an output indicative of the temperature. In this implementation, FPGA 204 is programmed to monitor the output of temperature sensor 320 and turn on the system cooling fan or heating element if the temperature exceeds a first threshold of a set of temperature thresholds and/or turn off the personal computer if the temperature exceeds a second threshold of the set of temperature thresholds. It will be understood that both the first set and the second set of temperature thresholds may comprise a minimum and/or a maximum temperature, and that the set of temperature thresholds may be exceeded when a temperature is above the maximum temperature or below the minimum temperature comprising the first and second sets of temperature thresholds. The first threshold may represent a first safety level to see if the personal computer's own heating or cooling can adapt to the environmental change and the second threshold may represent a temperature at which damage will occur to the personal computer or one of its components if the computer is not shut down. In addition, as described above, FPGA 208 may be programmed to store data received from environmental characteristic sensor 314 on non-volatile computer memory 210 for later access.

Still referring to FIG. 2, in particular implementations a voltage regulator 328 may be provided. Voltage regulator 328 may comprise any device capable of measuring and/or regulating a system voltage. Voltage regulator 328 is in communication with battery 334 and is monitored, through the FPGA 208, by diagnostic application 204 (via processor portion 202). In particular implementations, diagnostic application 204 is configured to provide a user with a visual indication of battery life remaining, estimate the amount of time the personal computer may continue to operate based upon the battery life remaining, and alert a user when the battery life remaining falls to a predetermined level. In other implementations, diagnostic application 204 initiates a shutdown of the personal computer and alerts a user to a shutdown prior to the shutdown being initiated when the battery life remaining falls to the predetermined voltage level. In still other implementations, an analog to digital converter 324 may be provided in communication with the FPGA 208. Analog to digital converter 324 may comprise any electronic device that converts an inputted analog voltage (in this case, system voltage) to a digital signal. Analog to digital converter 324 is in communication with battery 328 (via connection 336) and FPGA 208 (via connection 326). In a particular implementation, FPGA 208 is programmed to read an output from analog to digital converter 324, monitor the system voltage, and 1) command the personal computer to receive power from a backup battery if the system voltage falls below a first predetermined voltage level or 2) command the personal computer to shut down if the system voltage falls below the second, lower, predetermined voltage level. It will be understood that the predetermined voltage levels may be stored in non-volatile computer memory 210 (which is read by FPGA 208)

Figure 6:
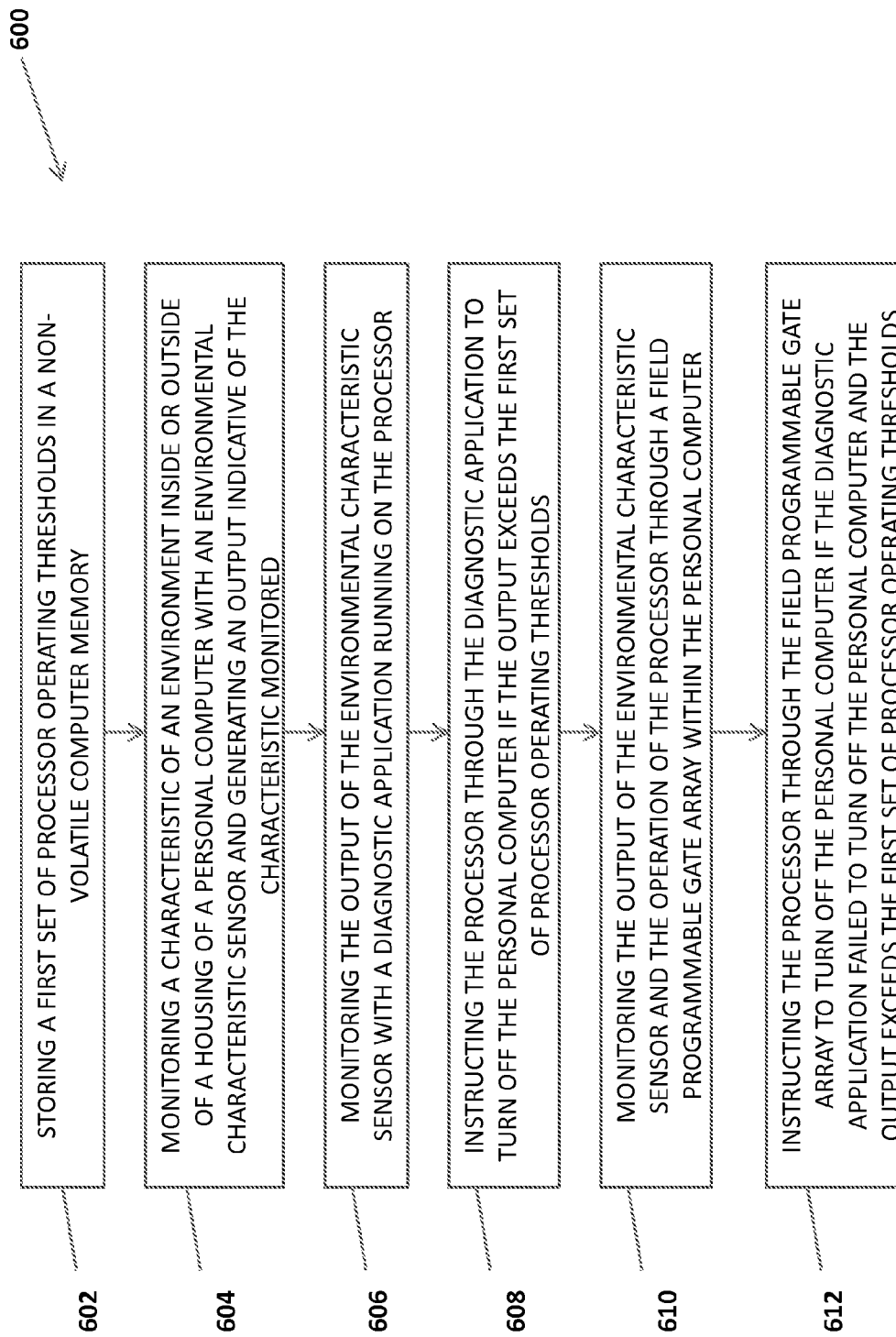
FIG. 6 is a third flow chart illustrating yet another particular implementation of a method for reconfiguring a personal computer.

FIG. 6 is a third flow chart illustrating another particular implementation of a method for reconfiguring a personal computer. The exemplary method 600 begins at step 602: storing a first set of processor operating thresholds in a non-volatile computer memory. Step 604 comprises monitoring a characteristic of an environment inside or outside of a housing of a personal computer with an environmental characteristic sensor and generating an output indicative of the characteristic monitored. Step 606 comprises monitoring, through the FPGA, the output of the environmental characteristic sensor with a diagnostic application running on the processor. Step 608 comprises instructing the processor through the diagnostic application to turn off the personal computer if the output exceeds the first set of processor operating thresholds. Step 610 comprises monitoring the output of the environmental characteristic sensor and the operation of the processor through a field programmable gate array within the personal computer. Step 612 comprises instructing the processor through the field programmable gate array to turn off the personal computer if the diagnostic application failed to turn off the personal computer and the output exceeds the first set of processor operating thresholds.

Figure 3:
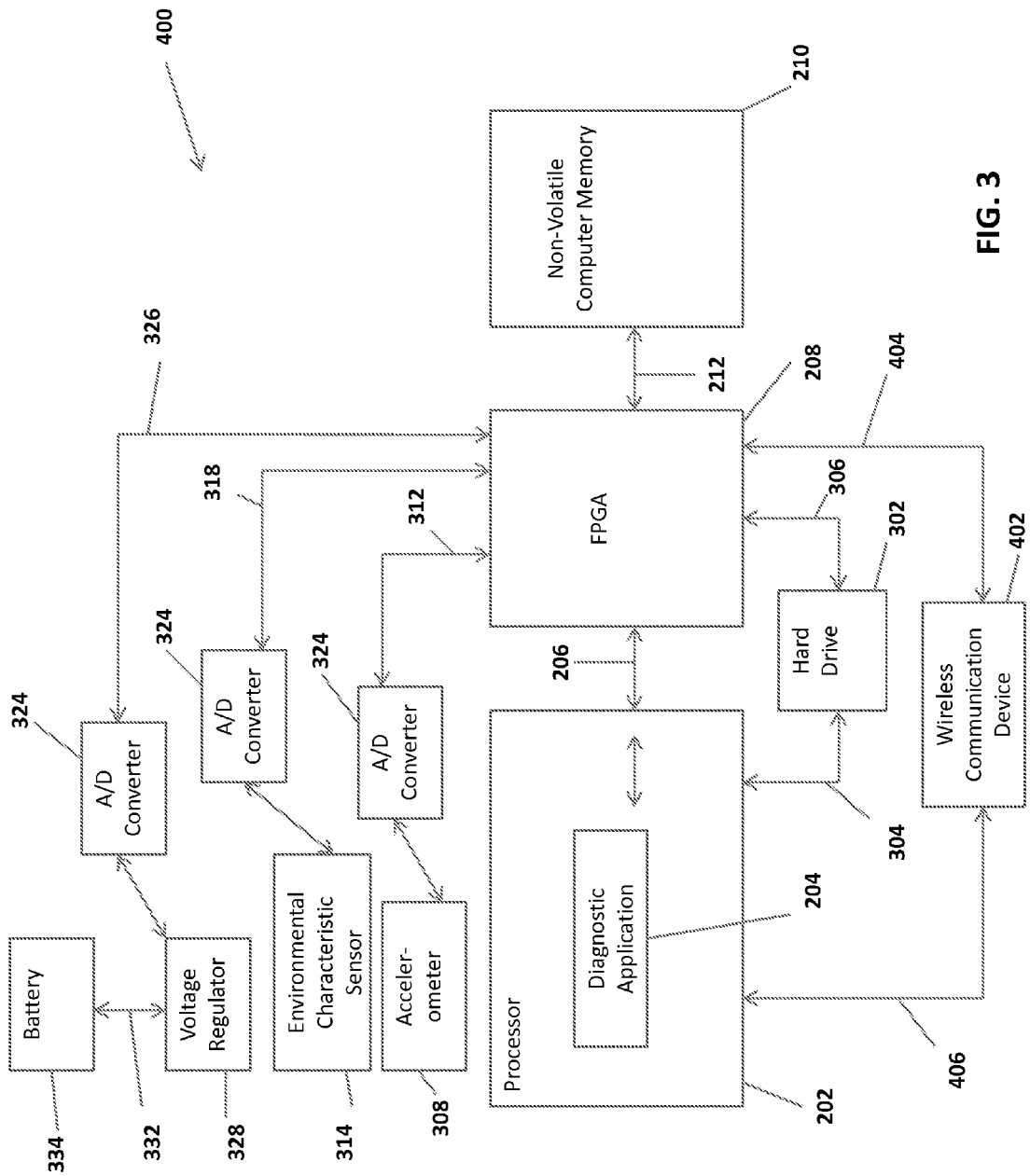
FIG. 3 is a block diagram of another particular implementation of a personal computer having an FPGA and a wireless communication receiver.

FIG. 3 is a block diagram of yet another particular implementation 400 of a personal computer having a field programmable gate array. This implementation may be configured like the previous implementations except that this implementation further comprises a wireless communication device 402. Wireless communication device 402 may comprise any device capable of wirelessly receiving a communication from and/or sending a communication to a remote computer system. By way of non-limiting example, a communication may comprise diagnosis of a problem associated with the personal computer, data stored within the personal computer, an Internet connection, receipt by the processor of a new set of hardware parameters for the FPGA, and the like. Wireless communication 402 may be made available to the processor 202 via connection 406 and to the FPGA 208 via connection 404. While the advantages of wireless communication for the personal computer 400 are many, in particular relation to the added functionality made possible through the use of FPGA 208, wireless communication device 402 allows for remote diagnosis and treatment of any problems associated with the personal computer 400. Particularly, because the FPGA 208 may be reprogrammed with different, additional hardware parameters, new hardware functionality may be downloaded to the personal computer 400 for reprogramming the FPGA from a remote location through the wireless connection. Whether the FPGA 208 is directly reprogrammed form the remote location or through the local processor 202, the ability to add new hardware to the personal computer while it is actively in use in the field to keep the personal computer operating and useful is a significant advantage.

Contemplated implementations of a computer having a field programmable gate array are many and can apply to many industries. For example, a potential implementation of the principles disclosed in this application could be a laptop computer system comprising a field programmable gate array in conjunction with a processor portion. Because the field programmable gate array may be made reconfigurable to accomplish virtually any computer function, the possibilities for reconfiguring the FPGA to achieve specialized functions are nearly endless. While the specific implementations of reconfigurable personal computers may initially be particularly useful in rugged, mobile environments, or in an asymmetrical, fast-paced environment, they also have many additional implementations in various other consumer, government, and other markets for which the desirability of the capabilities of the system described will become readily apparent from the present disclosure. The specific computer system types, industries, devices, and interfaces discussed in this application in no way restrict any possible implementation of the principles here disclosed to those systems, industries, devices, or interface types. Additionally, while particular examples of hardware components may be described in this disclosure, these examples do not serve to limit in any way the potential types of components or reconfigurability that may be implemented. Those skilled in the art will be able with the principles here disclosed to create many potential implementations.

It will be understood that implementations are not limited to the specific components disclosed herein, as virtually any components consistent with the intended operation of a method and/or system implementation for a computer having reconfigurable field programmable gate array may be utilized. Accordingly, for example, although particular processors, components and connections may be disclosed, such components may comprise any shape, size, style, type, model, version, class, grade, measurement, concentration, material, weight, quantity, and/or the like consistent with the intended operation of a method and/or system implementation for a personal computer may be used.

In places where the description above refers to particular implementations of personal computers, it should be readily apparent that a number of modifications may be made without departing from the spirit thereof and that these implementations may be applied to personal computers having other forms. For example, desktop, handheld, laptop, tablet, and other forms of personal computers are contemplated by the description provided herein. The accompanying claims are intended to cover such modifications as would fall within the true spirit and scope of the disclosure set forth in this document. The presently disclosed implementations are, therefore, to be considered in all respects as illustrative and not restrictive, the scope of the disclosure being indicated by the appended claims rather than the foregoing description. All changes that come within the meaning of and range of equivalency of the claims are intended to be embraced therein.

The invention claimed is:

1. A personal computer, comprising:
   a processor portion running a diagnostic application;
   a field programmable gate array interconnected with the processor portion;
   a battery;
   a system voltage;
   at least one analog to digital converter associated with the system voltage;
   and
   a configurable non-volatile computer memory interconnected with the field programmable gate array;
   wherein the field programmable gate array is programmed to reconfigure the non-volatile computer memory; and
   wherein the diagnostic application monitors an output of at least one other component of the personal computer through the field programmable gate array and
   wherein the non-volatile computer memory is configured to store a first predetermined voltage level and a second predetermined voltage level;
   wherein the field programmable gate array is programmed to receive an output from the at least one analog to digital converter, monitor the system voltage and command the personal computer to receive power from a backup battery if the system voltage falls below the first predetermined voltage level, and command the personal computer to shut down if the system voltage falls below the second predetermined voltage level.

2. The personal computer of claim 1, wherein the non-volatile computer memory comprises Flash memory.

3. The personal computer of claim 1, further comprising:
   an accelerometer coupled to the personal computer and associated with the field programmable gate array, the accelerometer configured to monitor gravity induced reaction forces and generate an output; and
   at least one hard drive inside a housing of the personal computer, the at least one hard drive having at least one hard drive head;
   wherein the field programmable gate array is programmed to monitor the output of the accelerometer for a free fall condition and issue a command to the at least one hard drive to park the at least one hard drive head.

4. The personal computer of claim 3, wherein the field programmable gate array is programmed to save accelerometer data on the configurable non-volatile computer memory when the accelerometer data exceeds a predetermined criteria boundary.

5. The personal computer of claim 3, further comprising at least one software application and at least one diagnostic application running on the processor portion, wherein the at least one diagnostic application is configured to receive the accelerometer data and provide the accelerometer data to the at least one software application.

6. The personal computer of claim 1, wherein the field programmable gate array is programmed with a first set of hardware parameters, the personal computer further comprising:
   an environmental characteristic sensor configured to monitor a characteristic of the environment inside or outside of a housing of the personal computer and generate an output indicative of the characteristic; and
   at least one diagnostic application running on the processor portion, wherein the at least one diagnostic application is configured to monitor the output of the environmental characteristic sensor through the field programmable gate array and reprogram the field programmable gate array with a second set of hardware parameters different from the first set of hardware parameters to add new functionality to the field programmable gate array in response to a need indicated by the environmental characteristic sensor output.

7. The personal computer of claim 6, wherein the field programmable gate array is programmed to save environmental characteristic sensor data on the configurable nonvolatile computer memory when the environmental characteristic sensor data exceeds a predetermined criteria boundary.

8. The personal computer of claim 6, the personal computer further comprising a wireless communication device, wherein the second set of hardware parameters is received by the personal computer through the wireless communication device.

9. A personal computer, comprising:

a processor portion running a diagnostic application;

a field programmable gate array interconnected with the processor portion; and a configurable non-volatile computer memory interconnected with the field programmable gate array;

wherein the field programmable gate array is programmed to reconfigure the non-volatile computer memory; and wherein the diagnostic application monitors an output of at least one other component of the personal computer through the field programmable gate array and wherein the non-volatile computer memory is configured to store a first set of processor operating thresholds, the personal computer further comprising;

an environmental characteristic sensor configured to monitor a characteristic of the environment inside or outside of a housing of the personal computer and generate an output indicative of the characteristic; and at least one diagnostic application running on the processor portion, wherein the at least one diagnostic application is configured to receive the output of the environmental characteristic sensor and turn off the personal computer if the output exceeds the first set of processor operating thresholds;

wherein the field programmable gate array is programmed to monitor the output of the environmental characteristic sensor and operation of the processor portion and turn off the personal computer if the output exceeds the first set of processor operating thresholds and the diagnostic application failed to turn off the personal computer.

10. The personal computer of claim 9, wherein the field programmable gate array is programmed with a first set of hardware parameters and the at least one diagnostic application is configured to reprogram the field programmable gate array with a second set of hardware parameters different from the first set of hardware parameters and replace the first set of processor operating thresholds with a second set of processor operating thresholds different from the first set of processor operating thresholds to add new functionality to the field programmable gate array through the processor portion and modify the operating conditions under which the field programmable gate array is programmed to turn off the personal computer.

11. A personal computer, comprising:
a processor portion running a diagnostic application;
a field programmable gate array interconnected with the processor portion; and
a configurable non-volatile computer memory interconnected with the field programmable gate array;
wherein the field programmable gate array is programmed to reconfigure the non-volatile computer memory; and
wherein the diagnostic application monitors an output of at least one other component of the personal computer through the field programmable gate array and
wherein the non-volatile computer memory is configured to store a set of temperature thresholds, the personal computer further comprising:
a temperature sensor configured to monitor a temperature inside a housing of the personal computer and generate an output indicative of the temperature; and
a system cooling fan;
wherein the field programmable gate array is programmed to monitor the output of the temperature sensor and:
turn on the fan if the temperature exceeds a first threshold of the set of temperature thresholds; and turn off the personal computer if the temperature exceeds a second threshold of the set of temperature thresholds.

12. A method of reconfiguring a personal computer, the method comprising:
storing a first set of processor operating thresholds in a non-volatile computer memory;
monitoring a characteristic of an environment inside or outside of a housing of a personal computer with an environmental characteristic sensor and generating an output indicative of the characteristic monitored;
monitoring the output of the environmental characteristic sensor with a diagnostic application running on the processor;
instructing the processor through the diagnostic application to turn off the personal computer if the output exceeds the first set of processor operating thresholds;
monitoring the output of the environmental characteristic sensor and the operation of the processor through a field programmable gate array within the personal computer; and
instructing the processor through the field programmable gate array to turn off the personal computer if the diagnostic application failed to turn off the personal computer and the output exceeds the first set of processor operating thresholds.

* * * * *